United States Patent
Morishima

(10) Patent No.: US 8,358,061 B2
(45) Date of Patent: Jan. 22, 2013

(54) COATING SOLUTION FOR FORMATION OF INTERMEDIATE LAYER, METHOD FOR PRODUCTION OF ORGANIC ELECTROLUMINESCENCE ELEMENT, AND ORGANIC ELECTROLUMINESCENCE ELEMENT

(75) Inventor: Shinichi Morishima, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 41 days.

(21) Appl. No.: 12/935,178

(22) PCT Filed: Mar. 24, 2009

(86) PCT No.: PCT/JP2009/055780
§ 371 (c)(1),
(2), (4) Date: Sep. 28, 2010

(87) PCT Pub. No.: WO2009/122958
PCT Pub. Date: Oct. 8, 2009

(65) Prior Publication Data
US 2011/0018432 A1    Jan. 27, 2011

(30) Foreign Application Priority Data
Mar. 31, 2008    (JP) .................................. 2008-090683

(51) Int. Cl.
*H01J 1/62* (2006.01)
(52) U.S. Cl. ........................................ 313/504; 313/506
(58) Field of Classification Search .................. 313/498, 313/504, 506, 512
See application file for complete search history.

(56) References Cited

U.S. PATENT DOCUMENTS

| | | | |
|---|---|---|---|
| 5,739,635 | A | 4/1998 | Wakimoto |
| 6,013,384 | A | 1/2000 | Kido et al. |
| 2003/0044645 | A1 | 3/2003 | Kambe et al. |
| 2004/0219389 | A1 | 11/2004 | Lee et al. |

FOREIGN PATENT DOCUMENTS

| | | |
|---|---|---|
| EP | 0740489 A1 | 10/1996 |
| EP | 1416549 A2 | 5/2004 |
| JP | 9-017574 A | 1/1997 |
| JP | 10-270172 A | 10/1998 |
| JP | 11-016678 A | 1/1999 |
| JP | 2000-164359 A | 6/2000 |
| JP | 2000-243569 A | 9/2000 |
| JP | 2001-351785 A | 12/2001 |
| JP | 2004-152766 A | 5/2004 |
| JP | 2007-162009 A | 6/2007 |
| WO | 2009/110075 A1 | 9/2009 |

OTHER PUBLICATIONS

Extended European Search Report issued Dec. 22, 2011 in European Patent Application No. 09727356.9.

(Continued)

*Primary Examiner* — Vip Patel
(74) *Attorney, Agent, or Firm* — Sughrue Mion, PLLC

(57) ABSTRACT

Disclosed is a coating solution for use in the formation of an intermediate layer in an organic electroluminescence element which comprises at least a pair of electrodes, a light-emitting layer arranged between the pair of electrodes and comprising an organic material, and the intermediate layer arranged between one of the electrodes and the light-emitting layer. The coating solution is produced by dissolving an alkali metal salt.

11 Claims, 1 Drawing Sheet

OTHER PUBLICATIONS

P.A.G. O'Hare and H.R. Hoekstra, "Thermochemistry of molybdates I. Standard enthalpy of formation of cesium molybdate (Cs2MO4)", Journal of Chemical Thermodynamics, vol. 5, Nov. 1973, pp. 851-856 (XP-002662954).

Office Action issued Aug. 31, 2011, in corresponding Chinese Patent Application No. 2011082600704000 with English translation.
Chinese Office Action issued Aug. 17, 2012 for Chinese Application No. 200980110896.6 by the Chinese Patent Office.
Japanese Office Action issued on Aug. 31, 2012 for Application No. 2008-090683 by the Japanese Patent Office.

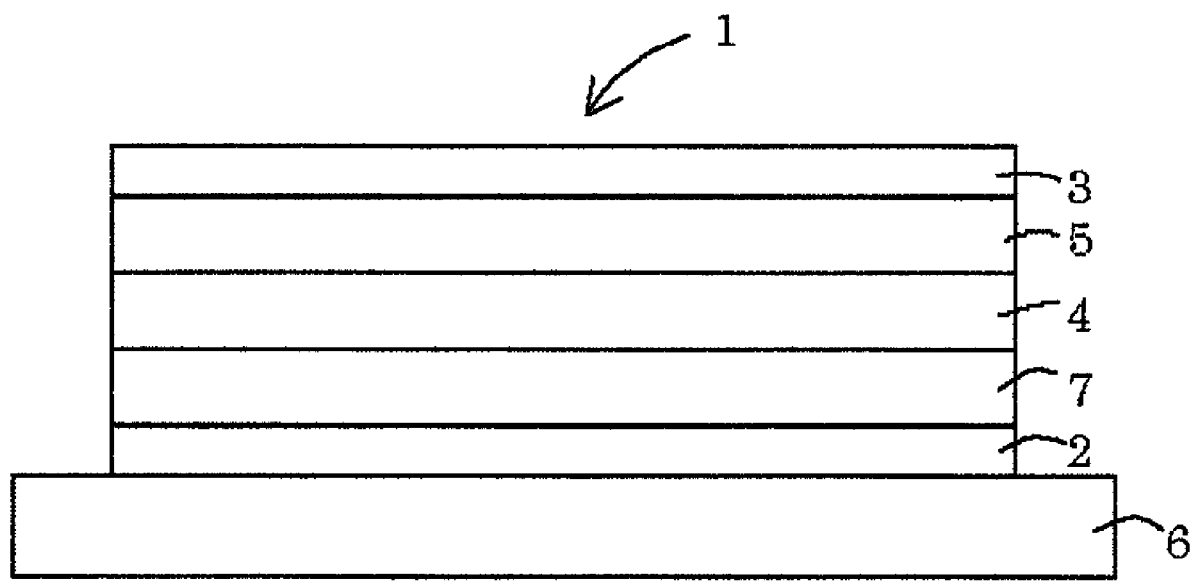

COATING SOLUTION FOR FORMATION OF INTERMEDIATE LAYER, METHOD FOR PRODUCTION OF ORGANIC ELECTROLUMINESCENCE ELEMENT, AND ORGANIC ELECTROLUMINESCENCE ELEMENT

CROSS REFERENCE TO RELATED APPLICATIONS

This application is a National Stage of International Application No. PCT/JP2009/055780, filed on Mar. 24, 2009, which claims priority from Japanese Patent Application No. 2008-090683, filed on Mar. 31, 2008, the contents of all of which are incorporated herein by reference in their entirety.

TECHNICAL FIELD

The present invention relates to an applying (a coating) solution for formation of an intermediate layer which is used in forming an intermediate layer in an organic electroluminescent device, a method for manufacturing an organic electroluminescent device, and an organic electroluminescent device formed using such applying solution.

BACKGROUND ART

An organic electroluminescent device (hereinafter, sometimes referred to as organic EL device) is one example of a light-emitting device. An organic EL device has a light-emitting layer including an organic material, and a pair of electrodes (an anode and a cathode) which sandwich this light-emitting layer. By applying a voltage to the pair of electrodes, holes are injected from the anode and electrons are injected from the cathode. These holes and electrons combine in the light-emitting layer, whereby light is emitted. In such an organic EL device, to lower the drive voltage, to lengthen the device life, and the like, intermediate layers different from the light-emitting layer are provided between the electrodes and the light-emitting layer. Examples of such intermediate layers include an electron injection layer, a hole injection layer, a hole transport layer, and an electron transport layer (e.g., refer to PATENT DOCUMENT 1 or 2).

PATENT DOCUMENT 1: JP 9-17574 A
PATENT DOCUMENT 2: JP 2000-243569 A

DISCLOSURE OF THE INVENTION

Problems to be Solved by the Invention

An electron injection layer is formed by, for example, vapor deposition methods such as electron beam (abbreviated as EB) vapor deposition or resistance heating vapor deposition. Since such a method requires a vacuum apparatus to create a vacuum atmosphere, there are the problems that the apparatus and the process become complicated, and that the manufacturing costs of the device are increased.

Therefore, it is an object of the present invention to provide a means for forming an intermediate layer by a simple method which does not require a vacuum atmosphere, a method for manufacturing an organic electroluminescent device using such means, and an organic electroluminescent device.

Means for Solving the Problems

To resolve the above-described problems, the present inventors investigated a method for forming an intermediate layer by an applying method which does not require a vacuum atmosphere, and discovered an applying solution for formation of an intermediate layer which can be used in such an applying method and which can be used to form an intermediate layer, thereby completing the present invention.

The present invention is an applying solution for use in formation of an intermediate layer in an organic electroluminescent device comprising at least a pair of electrodes, a light-emitting layer which is provided between the pair of electrodes and which comprises an organic material, and an intermediate layer provided between an electrode and the light-emitting layer, characterized in that the applying solution is obtained by dissolving an alkali metal salt.

Further, the present invention is an applying solution for formation of an intermediate layer, wherein the alkali metal salt is a salt of at least one acid selected from the group consisting of molybdic acid, tungstic acid, tantalic acid, niobic acid, vanadic acid, titanic acid, and zinc acid.

Further, the present invention is an applying solution for formation of an intermediate layer, wherein the alkali metal salt is a salt of at least one metal selected from the group consisting of lithium, sodium, potassium, rubidium, and cesium.

Further, the present invention is an applying solution for formation of an intermediate layer, wherein the alkali metal salt is a cesium salt.

Further, the present invention is an applying solution for formation of an intermediate layer, wherein the alkali metal salt is cesium molybdate.

Further, the present invention is an applying solution for formation of an intermediate layer, comprising an alcohol and/or water.

Further, the present invention is an applying solution for formation of an intermediate layer, comprising a surfactant.

Further, the present invention is an applying solution for formation of an intermediate layer, wherein a contact angle of the solution with respect to a substrate formed of polyethylene naphthalate is 60° or less.

Further, the present invention is an applying solution for formation of an intermediate layer, characterized in that the solution has a hydrogen ion index of from 7 to 13, inclusive.

Further, the present invention is a method for manufacturing an organic electroluminescent device by individually forming a pair of electrodes, a light-emitting layer which is provided between the pair of electrodes and which comprises an organic material, and an intermediate layer provided between an electrode and the light-emitting layer, characterized by:

forming the intermediate layer by an applying method using the above-described applying solution for formation of an intermediate layer.

Further, the present invention is an organic electroluminescent device, comprising:

a pair of electrodes;
a light-emitting layer which is provided between the pair of electrodes and which comprises an organic material; and
an intermediate layer provided between an electrode and the light-emitting layer,
wherein the intermediate layer is formed by an applying method using the above-described applying solution for formation of an intermediate layer.

ADVANTAGES OF THE INVENTION

According to the present invention, an intermediate layer can be easily formed by an applying method using an applying solution for formation of an intermediate layer, without having to create a vacuum atmosphere.

BRIEF DESCRIPTION OF THE DRAWING

FIG. 1 is a front view illustrating an organic EL device 1 according to an embodiment of the present invention.

DESCRIPTION OF REFERENCE NUMERALS

1 Organic EL device
2 Anode
3 Cathode
4 Light-emitting layer
5 Electron injection layer
6 Substrate
7 Hole injection layer

BEST MODE FOR CARRYING OUT THE INVENTION

FIG. 1 is a front view illustrating an organic electroluminescent device (hereinafter, sometimes referred to as organic EL device) 1 according to an embodiment of the present invention. The organic EL device 1 according to the present embodiment is used, for example, as a light source in a display device such as a full color display device, an area color display device, and a liquid crystal display device, and as a lighting device.

The organic EL device 1 according to the present embodiment includes a pair of electrodes (in the present embodiment, an anode 2 and a cathode 3), a light-emitting layer 4 including an organic material provided between the pair of electrodes, and an intermediate layer (in the present embodiment, an electron injection layer 5) provided between an electrode (in the present embodiment, the cathode 3) and the light-emitting layer 4. This intermediate layer is formed by an applying method using the below-described applying solution for formation of an intermediate layer. The organic EL device 1 according to the present embodiment further includes a substrate 6, and a hole injection layer 7 provided between the anode 2 and the light-emitting layer 4. The organic EL device 1 is configured so that the anode 2, the hole injection layer 7, the light-emitting layer 4, the electron injection layer 5, and the cathode 3 are laminated on the substrate 6 in that order, and is manufactured by forming the respective films.

The organic EL device 1 according to the present embodiment is a so-called bottom emission type device, in which light from the light-emitting layer 4 is extracted from the substrate 6 side. Therefore, the substrate 6 preferably has a high transmittance of light in the visible region. Further, it is also preferred to use a substrate 6 which does not change during the step of forming the organic EL device 1. A rigid substrate or a flexible substrate may be used. Preferred examples which may be used include glass, plastic, a polymer film, a silicon substrate, a metal plate, and a layered substrate of these. In addition, a substrate formed by subjecting plastic, a polymeric film and the like to a low-moisture-permeability treatment may also be used. A commercially-available product may be used for the substrate 6. Alternatively, a substrate manufactured by a known method may be used for the substrate 6. Further, for a so-called top-emission type organic EL device, in which the light is extracted from the cathode 3 side, the substrate may be impermeable to light.

It is preferred to use a thin film having a low electrical resistance for the anode 2. At least one of the anode 2 and the cathode 3 is transparent. For example, for a bottom emission type organic EL device, the anode 2 arranged on the substrate 6 side is transparent, so that it is preferred to use a material having a high transmittance of light in the visible region. As the anode 2 material, a conductive metal oxide film, metal thin film and the like may be used. Specifically, a thin film formed from indium oxide, zinc oxide, tin oxide, indium tin oxide (ITO), and indium zinc oxide (IZO), gold, platinum, silver, copper, aluminum, or an alloy containing at least one of those metals, or the like is used for the anode 2. Among these, based on transmittance and ease of patterning, it is preferred to use a thin film formed from ITO, IZO, and tin oxide as the anode 2. For a top-emission type organic EL device, it is preferred to form the anode 2 from a material which reflects the light from the light-emitting layer 4 to the cathode 3 side. Such material preferably is a metal, metal oxide, or metal sulfide having a work function of 3.0 eV or more. For example, a metal thin film having a thickness which is sufficient to reflect light is used.

Examples of methods for producing the anode 2 include vacuum vapor deposition, sputtering, ion plating, and plating. Further, as the anode 2, a transparent conductive film of an organic material, such as polyaniline or derivatives thereof and polythiophene or derivatives thereof may be used. In addition, a mixture including at least one or more of the material used for the above-described organic transparent conductive film and the like, a metal oxide, a metal sulfate, a metal and the like, and a carbon material such as carbon nanotubes may also be used. The thickness of the anode can be appropriately selected in consideration of light transmittance and electrical conductivity. The thickness is, for example, 5 nm to 10 μm, preferably 10 nm to 1 μm, and more preferably 20 nm to 500 nm.

The hole injection layer 7 is a layer having a function for improving the hole injection efficiency from the anode 2. The hole injection material constituting the hole injection layer 7 is not especially limited, and known materials may be appropriately used.

Examples thereof include a phenylamine compound, a starburst-type amine compound, a phthalocyanine compound, hydrazone derivatives, carbazole derivatives, triazole derivatives, imidazole derivatives, oxadiazole derivatives having an amino group, oxides such as vanadium oxide, molybdenum oxide, ruthenium oxide, and aluminum oxide, amorphous carbon, polyaniline, and polythiophene derivatives.

The hole injection layer 7 is formed, for example, by an applying method in which an applying solution including the above-described hole injection material is dissolved in a solvent. As the solvent, a solvent which dissolves the hole injection material may be used. Examples of the solvent include chlorinated solvents such as chloroform, water, methylene chloride and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate and ethyl cellosolve acetate.

Examples of the applying method for coating the hole injection layer 7 include spin coating, casting, micro gravure coating, gravure coating, bar coating, roll coating, wire bar coating, dip coating, spray coating, screen printing, flexographic printing, offset printing, inkjet printing and the like. The hole injection layer 7 can be formed using one of these applying methods, by applying the above-described applying solution to the substrate 6 on which the anode 2 is formed.

Further, the hole injection layer 7 can be formed using vacuum vapor deposition and the like. In addition, if the hole injection layer 7 is formed from a metal oxide, methods such as sputtering and ion plating may also be used.

The optimum thickness of the hole injection layer 7 depends on the used material, and is selected so that the drive voltage and the light emission efficiency are appropriate values. Further, the hole injection layer 7 needs to be thick enough so that pin holes do not form. However, the thickness is preferably not too thick, otherwise the drive voltage of the device increases. Therefore, the hole injection layer 7 has a thickness of, for example, from 1 nm to 1 µm, preferably 2 nm to 500 nm, and more preferably 5 nm to 200 nm.

The light-emitting layer 4 includes an organic material which emits fluorescence and/or phosphorescence, or alternatively, such organic material and a dopant. The dopant is added to the organic material for the purpose of, for example, improving the light emission efficiency, and changing the emission wavelength. The light-emitting material used for the light-emitting layer 4 may be a low-molecular weight compound or a polymer compound. Examples of the light-emitting material include the following.

Examples of pigment light-emitting materials include a cyclopentamine derivative, a tetraphenyl butadiene derivative compound, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a pyrazoline dimer, a quinacridone derivative, and a coumarin derivative.

Examples of the metal complex light-emitting materials include a metal complex having, for a central metal, Al, Zn, Be and the like, or a rare earth metal such as Tb, Eu, and Dy, and for a ligand, an oxadiazole, a thiadiazole, a phenylpyridine, a phenylbenzimidazole, a quinoline structure and the like. Further examples include metal complexes which emit light from a triplet excited state, such as iridium complexes and platinum complexes, and metal complexes such as an aluminum quinolinol complex, a benzoquinolinol beryllium complex, a benzoxazolyl zinc complex, a benzothiazole zinc complex, an azomethyl zinc complex, a porphyrin zinc complex, and europium complexes.

Examples of polymeric light-emitting materials include poly(p-phenylenevinylene) derivatives, polythiophene derivatives, poly(p-phenylene) derivatives, polysilane derivatives, polyacetylene derivatives, polyfluorene derivatives, polyvinylcarbazole derivatives, and polymers prepared by polymerizing the above-described pigment light-emitting material or metal complex light-emitting material.

Of these light-emitting materials, examples of blue emitting materials include distyrylarylene derivatives, oxadiazole derivatives and polymers thereof, polyvinylcarbazole derivatives, poly(p-phenylene) derivatives, and polyfluorene derivatives. Of these, polyvinylcarbazole derivatives, poly(p-phenylene) derivatives, polyfluorene derivatives, and the like, which are polymer materials, are preferred.

Examples of green emitting materials include quinacridone derivatives, coumarin derivatives, and polymers thereof, poly(p-phenylenevinylene) derivatives and polyfluorene derivatives. Of these, poly(p-phenylenevinylene) derivatives, polyfluorene derivatives, and the like, which are polymer materials, are preferred.

Examples of red emitting materials include coumarin derivatives, thiophene ring compounds, and polymers thereof, poly(p-phenylenevinylene) derivatives, polythiophene derivatives, and polyfluorene derivatives. Of these, poly(p-phenylenevinylene) derivatives, polythiophene derivatives, polyfluorene derivatives, and the like, which are polymer materials, are preferred.

Examples of dopant materials include perylene derivatives, coumarin derivatives, rubrene derivatives, quinacridone derivatives, squalium derivatives, porphyrin derivatives, styryl dyes, tetracene derivatives, pyrazolone derivatives, decacyclene, and phenoxazone. The thickness of such a light-emitting layer 4 is usually about 2 nm to 2,000 nm.

Examples of methods for forming the light-emitting layer 4 include applying a solution including the light-emitting material to the surface of the substrate, vacuum vapor deposition, a transfer method and the like. Examples of solvents which can be used for the solution including the light-emitting material include the solvents described as the applying solution solvent used for forming the hole injection layer 7.

Examples of methods for applying a solution including the light-emitting material include applying methods such as spin coating, casting, micro gravure coating, gravure coating, bar coating, roll coating, wire bar coating, dip coating, slit coating, capillary coating, spray coating, and nozzle coating, as well as other coating methods such as gravure printing, screen printing, flexographic printing, offset printing, reverse printing, and inkjet printing. From the standpoint that pattern formation and separation into multiple colors are easy, gravure printing, screen printing, flexographic printing, offset printing, reverse printing, and inkjet printing are preferred. Further, for a sublimable low molecular weight compound, vacuum vapor deposition can be used. Moreover, the light-emitting layer 4 can also be formed on only a desired region by a transfer method or a thermal transfer method performed with a laser or by abrasion, or the like.

The electron injection layer 5 is mainly provided to improve the injection efficiency of electrons from the cathode 3. The electron injection layer 5 can be formed by applying the applying solution for formation of an intermediate layer to the surface of the light-emitting layer 4, and then drying. The applying solution for formation of an intermediate layer used when forming the electron injection layer 5 can be obtained by dissolving an alkali metal salt. Although this applying solution for formation of an intermediate layer includes at least an alkali metal salt, it may also include different materials. Examples of a material different from the alkali metal salt included in the applying solution for formation of an intermediate layer include a conductive organic compound and a thickening stabilizer. More specifically, the electron injection layer 5 formed using the applying solution for formation of an intermediate layer may include an alkali metal salt. Further, the electron injection layer 5 may be formed only from an alkali metal salt.

The alkali metal salt is a salt of at least one metal selected from the group consisting of lithium, sodium, potassium, rubidium, and cesium. Of these, preferred is a salt of at least one metal selected from the group consisting of sodium, potassium, cesium, and lithium, and a cesium salt is most preferred. Since alkali metal salts have a low work function, the electron injection layer 5 formed using the applying solution for formation of an intermediate layer facilitates electron injection from the cathode 3. Consequently, a lower drive voltage for the organic EL device 1 can be achieved.

The alkali metal salt is preferably a salt of at least one acid selected from the group consisting of molybdic acid, tungstic acid, tantalic acid, niobic acid, vanadic acid, titanic acid, and zinc acid. Examples of the alkali metal salt include salts represent by the general formula $M_2MoO_4$, $M_2WO_4$, $M_2Ta_2O_6$, $M_2Nb_2O_6$, $M_3VO_4$, $M_2V_2O_6$, $M_2TiO_3$, and $M_2ZnO_2$ (wherein M represents an alkali metal). More specifically, examples include lithium molybdate, lithium tungstate, lithium vanadate, lithium niobate, lithium tantalate, lithium titanate, lithium zincate, sodium molybdate, sodium tungstate, sodium vanadate, sodium niobate, sodium tantalate, sodium titanate, sodium zincate, potassium molybdate, potassium tungstate, potassium vanadate, potassium niobate, potassium tantalate, potassium titanate, potassium zincate, rubidium molybdate, rubidium tungstate, rubidium vanadate, rubidium niobate, rubidium tantalate, rubidium titanate, rubidium zincate, cesium molybdate, cesium tungstate, cesium vanadate, cesium niobate, cesium tantalate, cesium titanate, and cesium zincate. Further, the alkali metal salt may be a salt of one or more alkali metals, or may be a salt of one or more acids. Examples thereof include lithium sodium molybdate tungstate, sodium cesium molybdate niobate, and cesium vanadate tantalate. In addition, the alkali metal salt is preferably a cesium salt, such as a cesium salt of at least one acid selected from the group consisting of molybdic acid, tungstic acid, tantalic acid, niobic acid, vanadic acid, and titanic acid. Of these, the alkali metal salt is preferably cesium molybdate ($Cs_2MoO_4$). By forming the electron injection layer 5 including cesium molybdate, the drive voltage of the organic EL device 1 can be effectively reduced. Moreover, since alkali metal salts have a lower reactivity than the alkali metals themselves, by using the applying solution for formation of an intermediate layer, an electron injection layer 5 which does not change much over time can be formed.

As the solvent for the applying solution for formation of an intermediate layer, a solvent which can dissolve the above-described alkali metal salt may be used. Preferably, such solvent includes an alcohol and/or water.

The applying solution for formation of an intermediate layer preferably further includes a surfactant. This surfactant lowers the surface tension of the applying solution for formation of an intermediate layer. Consequently, the wettability on the layer (in the present embodiment, the light-emitting layer 4) which the applying solution for formation of an intermediate layer is applied to improves, and the thickness of the intermediate layer (in the present embodiment, the electron injection layer 5) formed using the applying solution for formation of an intermediate layer can be made uniform. Examples of such a surfactant include an anionic surfactant, a cationic surfactant, a gemini (amphoteric) surfactant, and a nonionic surfactant. More specifically, examples include a polyhydric alcohol alkyl ether, a polyhydric alcohol alkyl ester, a polyoxyethylene alkyl ether, a polyoxyethylene alkyl ester, a polyoxypropylene alkyl ether, a polyoxypropylene alkyl ester, and acetylene glycol, or a fluorinated nonionic surfactant in which at least some of the hydrogen atoms in these alkyl groups are substituted with a fluorine atom. The higher the wettability of the applying solution for formation of an intermediate layer with respect to the layer to be coated (in the present embodiment, the light-emitting layer 4), the more the thickness of the intermediate layer can be made uniform. Therefore, it is preferred that this wettability is as high as possible. It is preferred that the contact angle of the applying solution for formation of an intermediate layer with respect to a substrate formed of polyethylene naphthalate (hereinafter, sometimes referred to as "PET") is 60° or less. Using an applying solution for formation of an intermediate layer which exhibits such a contact angle with respect to a PET substrate enables a flat intermediate layer (in the present embodiment, the electron injection layer 5) having a small surface roughness to be formed.

The applying solution for formation of an intermediate layer can be obtained by dissolving the above-described alkali metal salt in the above-described solvent such as an alcohol and/or water. Further, as described above, a surfactant may also be added. In addition, as the applying solution for formation of an intermediate layer, a liquid in which the alkali metal salt precipitates when the applying solution for formation of an intermediate layer is dried may be used. This applying solution for formation of an intermediate layer does not have to dissolve the alkali metal salt.

Examples of methods for applying the applying solution for formation of an intermediate layer to the surface of the light-emitting layer 4 include applying (coating) methods such as spin coating, casting, micro gravure coating, gravure coating, bar coating, roll coating, wire bar coating, dip coating, slit coating, capillary coating, spray coating, and nozzle coating, as well as other applying (coating) methods such as gravure printing, screen printing, flexographic printing, offset printing, reverse printing, and inkjet printing. From the standpoint that pattern formation and separation into multiple colors are easy, gravure printing, screen printing, flexographic printing, offset printing, reverse printing, inkjet printing and the like are preferred.

The optimum thickness of the electron injection layer 5 depends on the used material, and is selected so that the drive voltage and the light emission efficiency are appropriate values. Further, the electron injection layer 5 needs to be thick enough so that pin holes do not form. However, the thickness is preferably not too thick, otherwise the drive voltage of the device increases. Therefore, the electron injection layer 5 has a thickness of, usually, from 1 nm to 1 μm, preferably 2 nm to 500 nm, and more preferably 3 nm to 200 nm.

It is preferred that the cathode 3 material has a small work function, allows easy electron injection into the light-emitting layer 4, and has a high electrical conductivity. Further, in the case of extracting light from the anode 2 side, a material having a high visible light reflectance is preferred so that the light from the light-emitting layer 4 is reflected to the anode 2 side. Examples of materials which can be used for the cathode 3 include alkali metals, alkali earth metals, transition metals, and Group 3 metals. Specific examples of the material used for the cathode 3 include lithium, sodium, potassium, rubidium, cesium, beryllium, magnesium, calcium, strontium, barium, aluminum, scandium, vanadium, zinc, yttrium, indium, cerium, samarium, europium, terbium, ytterbium, gold, silver, platinum, copper, manganese, titanium, cobalt, nickel, tungsten, and tin, an alloy containing at least one or more of these metals, or graphite or a graphite intercalation compound. Examples of alloys include magnesium-silver alloy, magnesium-indium alloy, magnesium-aluminum alloy, indium-silver alloy, lithium-aluminum alloy, lithium-magnesium alloy, lithium-indium alloy, and calcium-aluminum alloy. Further, a transparent conductive electrode may be used as the cathode 3. For example, a thin film formed from a conductive metal oxide, such as indium oxide, zinc oxide, tin oxide, ITO, and IZO, may be used. Alternatively, a thin film formed from a conductive organic material, such as polyaniline or derivatives thereof and polythiophene or derivatives thereof, may be used. In addition, the cathode may be configured by laminating two or more layers.

In the above-described organic EL device 1 according to the present embodiment, the electron injection layer 5 can be formed by an applying method using the applying solution for formation of an intermediate layer. Consequently, compared with the conventional art like vapor deposition, in which the electron injection layer 5 is formed in a vacuum atmosphere, the need to create a vacuum atmosphere is eliminated, so that the electron injection layer 5 can be easily formed. This allows the manufacturing costs of the organic EL device 1 to be reduced.

Especially, since the electron injection layer 5 in contact with the cathode 3 is formed using an applying solution for formation of an intermediate layer obtained by dissolving an alkali metal salt, the drive voltage of the organic EL device 1 can be reduced.

It is sufficient for the organic EL device to have at least the light-emitting layer 4 provided between the anode 2 and the cathode 3. The layer structure between the anode 2 and the cathode 3 is not limited to the layer structure of the above-described organic EL device 1 according to the present embodiment. Although it is typical for one light-emitting layer to be provided, two or more light-emitting layers may be provided. In such a case, the two or more light-emitting layers can be laminated in direct contact with each other, or can be provided with a layer other than a light-emitting layer provided therebetween.

An example of the layer structure provided between the anode 2 and the cathode 3 will now be described. In the following, overlapping descriptions concerning the anode, cathode, light-emitting layer, hole injection layer, and electron injection layer are in some cases omitted.

Examples of layers that can be provided between the cathode and the light-emitting layer include an electron injection layer, an electron transport layer, and a hole blocking layer. When both an electron injection layer and an electron transport layer are provided between the cathode and the light-emitting layer, the layer positioned on the side closer to the cathode is called an electron injection layer, and the layer positioned on the side closer to the light-emitting layer is called an electron transport layer.

The electron injection layer has a function for improving the electron injection efficiency from the cathode. The electron transport layer has a function for improving electron injection from the cathode or the electron injection layer, or from an electron transport layer which is closer to the cathode. A hole blocking layer has a function for blocking hole transportation. The electron injection layer or the electron transport layer can simultaneously serve as a hole blocking layer.

Examples of layers that are provided between the anode and the light-emitting layer include the above-described hole injection layer, hole transport layer, and electron blocking layer. When both a hole injection layer and a hole transport layer are provided between the anode and the light-emitting layer, the layer positioned on the side closer to the anode is called a hole injection layer, and the layer positioned on the side closer to the light-emitting layer is called a hole transport layer.

The hole injection layer has a function for improving the hole injection efficiency from the anode. The hole transport layer has a function for improving hole injection from the anode or the hole injection layer, or from a hole transport layer which is closer to the anode. An electron blocking layer has a function for blocking electron transportation. The hole injection layer or the hole electron transport layer can simultaneously serve as an electron blocking layer.

The electron injection layer and the hole injection layer may be collectively referred to as charge injection layers, and the electron transport layer and the hole transport layer may be collectively referred to as charge transport layers. Further, the electron blocking layer and the hole blocking layer may be collectively referred to as charge blocking layers.

Examples of the layer structures which the organic EL device can have are illustrated below.

a) Anode/hole injection layer/hole transport layer/light-emitting layer/electron transport layer/electron injection layer/cathode b) Anode/hole injection layer/hole transport layer/light-emitting layer/electron transport layer/cathode c) Anode/hole injection layer/hole transport layer/light-emitting layer/electron injection layer/cathode d) Anode/hole injection layer/hole transport layer/light-emitting layer/cathode e) Anode/hole injection layer/light-emitting layer/electron transport layer/electron injection layer/cathode f) Anode/hole injection layer/light-emitting layer/electron transport layer/cathode g) Anode/hole injection layer/light-emitting layer/electron injection layer/cathode h) Anode/hole injection layer/light-emitting layer/cathode i) Anode/hole transport layer/light-emitting layer/electron transport layer/electron injection layer/cathode j) Anode/hole transport layer/light-emitting layer/electron transport layer/cathode k) Anode/hole transport layer/light-emitting layer/electron injection layer/cathode l) Anode/hole transport layer/light-emitting layer/cathode m) Anode/light-emitting layer/electron transport layer/electron injection layer/cathode n) Anode/light-emitting layer/electron transport layer/cathode o) Anode/light-emitting layer/electron injection layer/cathode p) Anode/light-emitting layer/cathode (here, the symbol "/" represents the fact that the two layers on either side of the "/" are laminated adjacent to each other. Hereinafter the same.)

In each of the above-described examples of layer structures, an electron blocking layer can be inserted between the light-emitting layer and the anode, or the hole injection layer, or the hole transport layer. Further, a hole blocking layer can also be inserted between the light-emitting layer and the cathode, or the electron injection layer, or the electron transport layer.

The organic EL device may also have two or more light-emitting layers. Examples of the device structure of an organic EL device having two light-emitting layers include the following.

q) Anode/hole injection layer/hole transport layer/light-emitting layer/electron transport layer/electron injection layer/electrode/hole injection layer/hole transport layer/light-emitting layer/electron transport layer/electron injection layer/cathode Further, examples of the device structure of an organic EL device having three or more light-emitting layers include, wherein (electrode/hole injection layer/hole transport layer/light-emitting layer/electron transport layer/electron injection layer) is one repeating unit, the following structures which include two or more of the above repeating unit.

r) Anode/charge injection layer/hole transport layer/light-emitting layer/electron transport layer/charge injection layer/ (repeating unit)/(repeating unit)/ . . . /cathode In the above-described layer structures q and r, layers other than the anode, cathode, and light-emitting layer may optionally be omitted. Further, in the above-described layer structures q and r, a charge injection layer in contact with the electron transport layer may also be formed by applying the applying solution for formation of an intermediate layer in the same manner as for the electron injection layer 5 according to the above-described embodiment.

For a bottom emission type organic EL device, in which the light is extracted from the substrate 6, the layers arranged on the substrate 6 side with respect to the light-emitting layer are all transparent. For a so-called top emission type organic EL device, in which the light is extracted from the cathode 3 side opposite to the substrate 6 side, the layers arranged on the cathode 3 side with respect to the light-emitting layer are all transparent.

To further improve adhesion with the electrodes and to improve the charge injection efficiency from the electrodes, the organic EL device may be provided with an insulating layer having a thickness of 2 nm or less adjacent to the electrodes. Further, to improve adhesion at the interfaces, to prevent mixing of the respective layers, and the like, a thin buffer layer may be inserted on the interface between adjacent layers.

Specific structures of the respective layers will now be described.

<Hole Transport Layer>

The hole transport material constituting the hole transport layer is not especially limited. Examples thereof include aromatic amine derivatives such as N,N'-diphenyl-N,N'-di(3-methylphenyl)4,4'-diaminobiphenyl (TPD) and NPB (4,4'-bis[N-(1-naphthyl)-N-phenylamino]biphenyl), polyvinylcarbazole or derivatives thereof, polysilane or derivatives thereof, polysiloxane derivatives having an aromatic amine in a side chain or in the main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly(p-phenylenevinylene) or derivatives thereof, and poly(2,5-thienylenevinylene) or derivatives thereof.

Among these hole transport materials, as the hole transport material, it is preferred to use a polymeric hole transport material, such as polyvinylcarbazole or derivatives thereof, polysilane or derivatives thereof, polysiloxane derivatives having an aromatic amine compound group in a side chain or in the main chain, polyaniline or derivatives thereof, polythiophene or derivatives thereof, polyarylamine or derivatives thereof, poly(p-phenylenevinylene) or derivatives thereof or poly(2,5-thienylenevinylene) or derivatives thereof. Further, it is more preferred to use polyvinylcarbazole or derivatives thereof, polysilane or derivatives thereof, and polysiloxane derivatives having an aromatic amine in a side chain or in the main chain. For a low-molecular weight hole transport material, it is preferred to use such a material by dispersing it in a polymeric binder.

Examples of the method for forming the hole transport layer include, for a low molecular weight hole transport material, forming the layer from a mixed solution with a polymeric binder, and for a polymeric binder, forming the layer from a solution.

As the solvent used for forming a film from a solution, a solvent in which the hole transport material is dissolved may be used. Examples thereof include chlorinated solvents such as chloroform, methylene chloride and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate and ethyl cellosolve acetate.

Examples of the method for forming a film from a solution include the same applying methods as described for the method for forming the hole injection layer 7.

As the mixed polymeric binder, it is preferred to use a binder that does not excessively inhibit charge transportation, and also preferred to use a binder that has a weak absorbance of visible light. Examples of such a polymeric binder include polycarbonate, polyacrylate, polymethyl acrylate, polymethyl methacrylate, polystyrene, polyvinyl chloride and polysiloxane.

The optimum thickness of the hole transport layer depends on the used material, and is selected so that the drive voltage and the light emission efficiency are appropriate values. Further, the hole transport layer needs to be thick enough so that pin holes do not form. However, the thickness is preferably not too thick, otherwise the drive voltage of the device increases. Therefore, the hole transport layer has a thickness of, for example, from 1 nm to 1 μm, preferably 2 nm to 500 nm, and more preferably 5 nm to 200 nm.

<Electron Transport Material>

Examples of the electron transport material constituting the electron transport layer include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline or derivatives thereof, polyquinoxaline or derivatives thereof and polyfluorene or derivatives thereof.

Among these, as the electron transport material, preferable are oxadiazole derivatives, benzoquinone or derivatives thereof, anthraquinone or derivatives thereof; or metal complexes of 8-hydroxyquinoline or derivatives thereof, polyquinoline or derivatives thereof, polyquinoxaline or derivatives thereof and polyfluorene or derivatives thereof, and more preferable are 2-(4-biphenylyl)-5-(4-t-butylphenyl)-1,3,4-oxadiazole, benzoquinone, anthraquinone, tris(8-quinolinol)aluminum and polyquinoline.

Examples of methods for forming the electron transport layer include, for a low molecular weight electron transport material, vacuum vapor deposition from a powder, or forming the layer from a solution or a molten state. For polymeric electron transport materials, examples include a method in which the layer is formed from a solution or a molten state. When performing film-formation from a solution or a molten state, the polymeric binder may be used simultaneously. Examples of methods for forming the electron transport layer from a solution include the same methods as described above for forming the hole transport layer from a solution.

The optimum thickness of the electron transport layer depends on the used material, and may be selected so that the drive voltage and the light emission efficiency are appropriate values. Further, the electron transport layer needs to be thick enough so that pin holes do not form. However, the thickness is preferably not too thick, otherwise the drive voltage of the device increases. Therefore, the electron transport layer has a thickness of, for example, from 1 nm to 1 μm, preferably 2 nm to 500 nm, and more preferably 5 nm to 200 nm.

The applying solution for formation of an intermediate layer is used as an applying solution for forming not only the above-described electron injection layer 5 but also the cathode. The electron injection layer 5 does not have to be provided in contact with the cathode 3. A layer different from the electron injection layer 5 may be inserted between the electron injection layer 5 and the cathode 3. Further, as described above, a layer different from the electron injection layer 5 may be inserted between the electron injection layer 5 and the light-emitting layer 4. In addition, since the applying solution for formation of an intermediate layer improves the charge injection properties, the applying solution for formation of an intermediate layer may also be used as an electrode for an organic solar cell, an organic transistor, and the like, or as an intermediate layer provided between an electrode and an organic material.

Further, it is preferred that the applying solution for formation of an intermediate layer has a hydrogen ion index of from 7 to 13, inclusive. If such an applying solution for formation of an intermediate layer is used, for example, an intermediate layer which includes an alkali metal salt can be formed by applying the applying solution for formation of an intermediate layer onto a film which readily dissolves in a solution exhibiting acidity. For example, the applying solution for formation of an intermediate layer can be preferably used when forming an intermediate layer including an alkali metal salt on an electrode formed from ITO, which readily dissolves in a solution exhibiting acidity.

EXAMPLES

As examples, first, applying solutions for formation of an intermediate layer were produced.

Example 1

A $Cs_2MoO_4$ powder (purity 99.9%, manufactured by Furuuchi Chemical Corporation) and ultrapure water (electrical resistivity of 15 MΩ·cm or more) were weighed in a weight ratio of 10:90 by weight, then charged into a screw tube and stirred to produce an applying solution for formation of an intermediate layer. The fact that the $Cs_2MoO_4$ powder was completely dissolved was visually confirmed. The surface tension of the produced applying solution for formation of an intermediate layer was 58.3 mN/m. Table 1 shows the results of each of the measured contact angles between the produced applying solution for formation of an intermediate layer and a plurality of substrates. The pH (hydrogen ion index) measured using pH test paper was about 7.

Example 2

A $Cs_2MoO_4$ powder (purity 99.9%, manufactured by Furuuchi Chemical Corporation), ultrapure water (electrical resistivity of 15 MΩ·cm or more), and ethanol (purity 99.5%, Cica-Reagent, Kanto Chemical Co., Inc.) were weighed in a weight ratio of 10:26:63 by weight. The $Cs_2MoO_4$ powder and the ultrapure water were charged into a screw tube in that order and stirred, and then the ethanol was mixed therein to produce an applying solution for formation of an intermediate layer. The fact that the $Cs_2MoO_4$ powder was completely dissolved was visually confirmed. The surface tension of the produced applying solution for formation of an intermediate layer was 22.6 mN/m. Table 1 shows the results of each of the measured contact angles between the produced applying solution for formation of an intermediate layer and a plurality of substrates. The pH measured using pH test paper was about 8 to 9.

Example 3

A $Cs_2MoO_4$ powder (purity 99.9%, manufactured by Furuuchi Chemical Corporation), ultrapure water (electrical resistivity of 15 MΩ·cm or more), ethanol (purity 99.5%, Cica-Reagent, Kanto Chemical Co., Inc.), and a surfactant (Surfynol® 104A, manufactured by Nissin Chemical Co., Ltd.) were weighed in a weight ratio of 10:25:61:4 by weight. The $Cs_2MoO_4$ powder and the ultrapure water were charged into a screw tube in that order and stirred, then the ethanol was mixed therein, and then the surfactant was mixed therein to produce an applying solution for formation of an intermediate layer. The fact that the $Cs_2MoO_4$ powder was completely dissolved was visually confirmed. The surface tension of the produced applying solution for formation of an intermediate layer was 26.6 mN/m. Table 1 shows the results of the measured contact angles between the produced applying solution for formation of an intermediate layer and a plurality of substrates. The pH measured using pH test paper was about 8 to 9.

Example 4

A $Cs_3VO_4$ powder (purity 99.9%, manufactured by Aldrich) and ultrapure water (electrical resistivity of 15 MΩ·cm or more) were weighed in a weight ratio of 1:99 by weight, then charged into a screw tube and stirred to produce an applying solution for formation of an intermediate layer. The fact that the $Cs_3VO_4$ powder was completely dissolved was visually confirmed. The pH measured using pH test paper was about 7.

Example 5

A $CsVO_3$ powder (purity 99.9%, manufactured by Aldrich) and ultrapure water (electrical resistivity of 15 MΩ·cm or more) were weighed in a weight ratio of 1:99 by weight, then charged into a screw tube and stirred to produce an applying solution for formation of an intermediate layer. The fact that the $CsVO_3$ powder was completely dissolved was visually confirmed. The pH measured using pH test paper was about 12.

Example 6

A $CsVO_3$ powder (purity 99.9%, manufactured by Aldrich) and ultrapure water (electrical resistivity of 15 MΩ·cm or more) were weighed in a weight ratio of 30:70 by weight, then charged into a screw tube and stirred to produce an applying solution for formation of an intermediate layer. The pH of the supernatant measured using pH test paper was about 13.

Example 7

A $K_2MoO_4$ powder (purity 98%, manufactured by Aldrich) and ultrapure water (electrical resistivity of 15 MΩ·cm or more) were weighed in a weight ratio of 1:99 by weight, then charged into a screw tube and stirred to produce an applying solution for formation of an intermediate layer. The fact that the $K_2MoO_4$ powder was completely dissolved was visually confirmed. The pH measured using pH test paper was about 7.5.

Example 8

A $K_2MoO_4$ powder (purity 98%, manufactured by Aldrich) and ultrapure water (electrical resistivity of 15 MΩ·cm or more) were weighed in a weight ratio of 30:70 by weight, then charged into a screw tube and stirred to produce an applying solution for formation of an intermediate layer. The pH of the supernatant measured using pH test paper was about 9.

Example 9

A $Na_2MoO_4$ powder (purity >98%, manufactured by Aldrich) and ultrapure water (electrical resistivity of 15 MΩ·cm or more) were weighed in a weight ratio of 1:99 by weight, then charged into a screw tube and stirred to produce an applying solution for formation of an intermediate layer. The fact that the $Na_2MoO_4$ powder was completely dissolved was visually confirmed. The pH measured using pH test paper was about 7.

Example 10

A $Na_2MoO_4$ powder (purity >98%, manufactured by Aldrich) and ultrapure water (electrical resistivity of 15 MΩ·cm or more) were weighed in a weight ratio of 30:70 by weight, then charged into a screw tube and stirred to produce an applying solution for formation of an intermediate layer. The pH of the supernatant measured using pH test paper was about 8.

Comparative Example

A $BaMoO_4$ powder (purity >99.9%, manufactured by Aldrich) and ultrapure water (electrical resistivity of 15 MΩ·cm or more) were weighed in a weight ratio of 1:99 by weight, then charged into a screw tube and stirred to produce an applying solution for formation of an intermediate layer. The fact that the $BaMoO_4$ powder was hardly dissolved was visually confirmed. The pH measured using pH test paper was about 7.

(Methods for Measuring Surface Tension and Contact Angle)

An OCA-20 model measurement apparatus manufactured by Data Physics Corporation (Germany) was used for measurement. The surface tension was measured by, first, filling the solution into a syringe, attaching a metal needle having an outer diameter of 1.4 mm to the syringe, extracting the solution from the metal needle, and performing image analysis on the shape just before the solution separated from the metal needle.

The contact angle was determined by bringing the solution into contact with the substrate so that the solution adhered to it, and then measuring the angle formed between the liquid surface where the liquid surface of the adhered solution was in contact with the surface of the substrate and the surface of the substrate. As the substrate, the following seven types of substrate were used: (1) an untreated alkali-free glass substrate which had not been subjected to a $UV-O_3$ cleaning treatment; (2) an alkali-free glass substrate which had been subjected to a $UV-O_3$ cleaning treatment (in Table 1, described as "UV cleaning") for 10 minutes by an apparatus manufactured by Technovision Inc.; (3) an untreated ITO substrate which was formed by sputtering an ITO thin film having a thickness of 150 nm on a glass substrate, which had not been subjected to a $UV-O_3$ cleaning treatment; (4) an ITO substrate formed by sputtering an ITO thin film having a thickness of 150 nm on a glass substrate which had been subjected to a $UV-O_3$ cleaning treatment for 10 minutes by an apparatus manufactured by Technovision Inc.; (5) an Al vapor deposition substrate produced by forming an aluminum thin film having a thickness of 300 nm on a glass substrate by an EB method; (6) a polymer spin deposition substrate produced by forming an 80 nm-thick polymer by spin coating a polymer light-emitting organic material (SCB 670, manufactured by Sumation Co., Ltd.) on a glass substrate; and (7) seven polyethylene naphthalate (PEN) substrate formed from PEN. For each of these substrates, the contact angle with the applying solutions for formation of an intermediate layer produced in Examples 1 to 3 was measured.

Table 1 shows the measurement results of the contact angles between the applying solutions for formation of an intermediate layer produced in Examples 1 to 3 and the plurality of substrates.

TABLE 1

| | Alkali-free glass substrate | | ITO substrate | | (5) | (6) | |
| --- | --- | --- | --- | --- | --- | --- | --- |
| | (1) Untreated | (2) UV cleaning | (3) Untreated | (4) UV cleaning | Al vapor deposition substrate | Polymer spin deposition substrate | (7) PEN substrate |
| Example 1 | 27 | 2 | 90 | 6 | 30 | 96 | 98 |
| Example 2 | 4 | 4 | 5 | 3 | 3 | 18 | 48 |
| Example 3 | 6 | 8 | 7 | 6 | 8 | 9 | 47 |

As illustrated in Examples 1 to 10, an applying solution for formation of an intermediate layer in which an alkali metal salt is dissolved can be produced. Further, as illustrated in Examples 2 and 3, an applying solution for formation of an intermediate layer having a low surface tension and a small contact angle can be produced by adding an alcohol or a surfactant to ultrapure water.

Example 11

An organic EL device was produced using the applying solution for formation of an intermediate layer produced in Example 3. The structure of the organic EL device produced in the Example was glass substrate/anode formed from an ITO thin film/hole injection layer/electron blocking layer/light-emitting layer/electron injection layer/cathode. This structure was further sealed with a sealing glass. Moreover, the electron injection layer was formed using the applying solution for formation of an intermediate layer produced in Example 3.

Preparation Example

A polymer compound 1 which will form the above-described electron blocking layer was produced. First, a separable flask including a stirring blade, a baffle, a nitrogen introducing tube whose length was adjustable, a cooling tube, and a thermometer, was charged with 158.29 parts by weight of 2,7-bis(1,3,2-dioxaborolane-2-yl)-9,9-dioctylfluorene, 136.11 parts by weight of bis(4-bromophenyl)-4-(1-methylpropyl)-benzenamine, 27 parts by weight of tricaprylmethylammonium chloride (Aliquat 336, manufactured by Henkel) and 1,800 parts by weight of toluene. While introducing nitrogen from the nitrogen introducing tube, the temperature was increased to 90° C. under stirring. After adding 0.066 parts by weight of palladium (II) acetate and 0.45 parts by weight of tri(o-toluoyl)phosphine, 573 parts by weight of an aqueous solution of 17.5% sodium carbonate was dropped over one hour. After completion of the dropping, the nitrogen introducing tube was pulled up from the solution surface, and the solution was kept warm under reflux for 7 hours. Then, 3.6 parts by weight of phenylboric acid was added. The temperature was kept warm under reflux for 14 hours, and then cooled to room temperature. The aqueous layer was removed from the reaction solution. Subsequently, the oil layer of the reaction solution was diluted with toluene, and washed with an aqueous solution of 3% acetic acid and ion-exchange water. The separated oil layer was charged with 13 parts by weight of sodium N,N-diethyldithiocarbamate trihydrate, and the resultant mixture was stirred for 4 hours. Then, the mixture was passed through a mixed column of active alumina and silica gel. Toluene was passed through the column to wash the column. The filtrate and the washing solution were mixed, and dropped into methanol to precipitate a polymer. The resultant polymer precipitate was filtered off, and then the precipitate was washed with methanol. Subsequently, the polymer was dried by a vacuum dryer, thus obtaining 192 parts by weight of the polymer. The obtained polymer will be referred to as polymer compound 1. The polystyrene equivalent weight average molecular weight of the polymer compound 1 was $3.7 \times 10^5$ and the number average molecular weight was $8.9 \times 10^4$.

(GPC Analysis Method)

The polystyrene equivalent weight average molecular weight and the number average molecular weight were determined by gel permeation chromatography (GPC). Standard polystyrene manufactured by Polymer Laboratories was used to prepare a GPC calibration curve. The polymer to be measured was dissolved in tetrahydrofuran to a concentration of about 0.02 wt. %, and 10 μL thereof was injected into a GPC apparatus. LC-10ADvp manufactured by Shimadzu Corporation was used as the GPC apparatus. Two PLgel 10 μm MIXED-B columns (300×7.5 mm) manufactured by Polymer Laboratories connected in series were used as the column. Tetrahydrofuran was flowed at a flow rate of 1.0 mL/min at 25° C. as a mobile phase. A UV detector was used as a detector. Absorbance at 228 nm was measured.

A glass substrate was used for the substrate. An ITO thin film formed on the surface of this substrate by sputtering and then patterned into a predetermined shape was used for the anode. The thickness of the ITO thin film was about 150 nm.

A suspension of poly(3,4)ethylenedioxythiophene/polystyrene sulfonic acid (trade name: Bytron P/TP AI 4083, manufactured by H.C. Starck VTech) was filtered with a filter having a 0.5 μm diameter. The filtrate was applied to glass substrate formed with the ITO thin film thereon by spin coating to form a film having a thickness of 60 nm. Next, the film formed on the extraction sections of the electrodes and the sealing area was wiped off. Then, drying was carried out at about 200° C. for 10 minutes under an air atmosphere using a hot plate to form the hole injection layer.

Next, an applying solution containing the above-described polymer compound 1 was applied to the substrate formed with the hole injection layer thereon by spin coating to form a film having a thickness of about 20 nm. Next, the film formed on the extraction sections of the electrodes and the sealing area was wiped off. Then, baking treatment was carried out at about 200° C. for 20 minutes under a nitrogen atmosphere using a hot plate to form the electron blocking injection layer.

Next, a polymeric light-emitting organic material (BP 361, manufactured by Sumation Co., Ltd.) was applied to the substrate formed with the electron blocking layer thereon by spin coating to form a film having a thickness of about 70 nm. Then, the film formed on the extraction sections of the electrodes and the sealing area was wiped off. A baking treatment was then carried out to form the light-emitting layer.

Next, the applying solution for formation of an intermediate layer produced in Example 3 was applied onto the substrate on which the light-emitting layer was formed by spin coating to form a 2 nm-thick electron injection layer. Then, the film formed on the extraction sections of the electrodes and the sealing area was wiped off, and the substrate was moved to a heating chamber in a vacuum vapor deposition apparatus (Small-ELVESS) manufactured by TOKKI Corporation (hereinafter, the process was carried out in a vacuum or in nitrogen, so that the device is not exposed to during the process). Then, the substrate was heated at a substrate temperature of about 80 to 120° C. for 20 minutes under a degree of vacuum of $1 \times 10^{-4}$ Pa or lower.

Subsequently, the substrate was moved to the vapor deposition chamber, and a metal mask for the cathode was positioned so that the cathode would be formed on the light-emitting portion and the extraction sections of the electrodes. Then, the cathode was formed by vapor deposition while rotating the metal mask and the substrate without changing their relative position. The degree of vacuum in the chamber prior to starting vapor deposition was $3 \times 10^{-5}$ Pa or lower. Using electron beam vapor deposition as the vapor deposition method, an Al film was formed at a vapor deposition rate of about 10 Å/sec to form a 100 nm-thick cathode. Subsequently, a sealing glass coated with a UV-ray curing resin on the periphery of the surface was bonded to the substrate under reduced pressure in an inert gas. Then, the pressure was returned to atmospheric pressure, and UV-rays were irradiated to photo-cure the UV-ray curing resin so that the sealing glass was fixed to the substrate, thereby producing a polymer organic EL device. The light-emitting region of one pixel was 2 mm×2 mm.

(Organic EL Device Evaluation)

Using the organic EL measurement apparatus manufactured by Tokyo System Development Co., Ltd., the current-voltage-luminance and the emission spectrum were measured. When a voltage of about 12 V was applied to the organic EL device produced in the present embodiment, front face luminance was 1,000 cd/m$^2$. The current density at this stage was 0.088 A/cm$^2$, and the EL emission spectrum exhibited a peak at 460 nm. Thus, it was confirmed that an organic EL device having an electron injection layer formed by an applying method using an applying solution for formation of an intermediate layer emits light.

INDUSTRIAL APPLICABILITY

According to the present invention, an intermediate layer can be easily formed by an applying method using an applying solution for formation of an intermediate layer, without having to create a vacuum atmosphere.

The invention claimed is:

1. An applying solution for use in formation of an intermediate layer in an organic electroluminescent device, the organic electroluminescent device comprising at least a pair of electrodes, a light-emitting layer which is provided between the pair of electrodes and which comprises an organic material, and an intermediate layer provided between an electrode and the light-emitting layer, characterized in that the applying solution is obtained by dissolving an alkali metal salt and comprises an alcohol.

2. The applying solution according to claim 1, wherein the alkali metal salt is a salt of at least one acid selected from the group consisting of molybdic acid, tungstic acid, tantalic acid, niobic acid, vanadic acid, titanic acid, and zinc acid.

3. The applying solution according to claim 1, wherein the alkali metal salt is a salt of at least one metal selected from the group consisting of lithium, sodium, potassium, rubidium, and cesium.

4. The applying solution according to claim 1, wherein the alkali metal salt is a cesium salt.

5. The applying solution according to claim 1, wherein the alkali metal salt is cesium molybdate.

6. The applying solution according to claim 1, further comprising water.

7. The applying solution according to claim 1, comprising a surfactant selected from the group consisting of an anionic surfactant, a cationic surfactant, a gemini (amphoteric) surfactant, and a nonionic surfactant.

8. The applying solution for the formation of an intermediate layer according to claim 1, wherein a contact angle of the solution with respect to a substrate formed of polyethylene naphthalate is 60° or less.

9. The applying solution according to claim 1, wherein the solution has a hydrogen ion index of from 7 to 13, inclusive.

10. A method of manufacturing an organic electroluminescent device by individually forming at least a pair of electrodes, a light-emitting layer which is provided between the pair of electrodes and which comprises an organic material, and an intermediate layer provided between an electrode and the light-emitting layer, comprising the step of:
   forming the intermediate layer by an applying method using an applying solution according to claim 1.

11. An organic electroluminescent device, comprising at least:
   a pair of electrodes;
   a light-emitting layer which is provided between the pair of electrodes and which comprises an organic material; and
   an intermediate layer provided between an electrode and the light-emitting layer,
   wherein the intermediate layer is formed by an applying method using an applying solution according to claim 1.

* * * * *